(12) United States Patent
Elsherbini et al.

(10) Patent No.: US 12,713,924 B2
(45) Date of Patent: Aug. 18, 2026

(54) DEVICE, METHOD, AND SYSTEM TO PROTECT THROUGH-DIELECTRIC VIAS OF A COMPOSITE CHIPLET

(71) Applicant: Intel Corporation, Santa Clara, CA (US)

(72) Inventors: Adel Elsherbini, Chandler, AZ (US); Mohammad Enamul Kabir, Portland, OR (US); Johanna Swan, Scottsdale, AZ (US); Omkar Karhade, Chandler, AZ (US); Kimin Jun, Portland, OR (US); Feras Eid, Chandler, AZ (US); Shawna Liff, Scottsdale, AZ (US); Xavier Brun, Hillsboro, OR (US); Bhaskar Jyoti Krishnatreya, Hillsboro, OR (US); Tushar Talukdar, Wilsonville, OR (US); Haris Khan Niazi, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 17/891,704

(22) Filed: Aug. 19, 2022

(65) Prior Publication Data

US 2024/0063147 A1 Feb. 22, 2024

(51) Int. Cl.
*H10W 42/00* (2026.01)
*H10W 70/09* (2026.01)
(Continued)

(52) U.S. Cl.
CPC .......... *H10W 42/00* (2026.01); *H10W 70/09* (2026.01); *H10W 74/01* (2026.01); (Continued)

(58) Field of Classification Search
None
See application file for complete search history.

(56) References Cited

U.S. PATENT DOCUMENTS 5,272,104 A 12/1993 Schrantz et al.
6,211,463 B1 4/2001 Fabis
(Continued)

FOREIGN PATENT DOCUMENTS

CN 205039151 2/2016
CN 111627887 9/2020

OTHER PUBLICATIONS

Jani, I., et al., "Innovative structures to test bonding alignment and characterize high density interconnects in 3D-IC", 15th IEEE International New Circuits and Systems Conference (NEWCAS), 2017, pp. 153-156.

(Continued)

*Primary Examiner* — Nishath Yasmeen
(74) *Attorney, Agent, or Firm* — Essential Patents Group, LLP

(57) ABSTRACT

Techniques and mechanisms to mitigate corrosion to via structures of a composite chiplet. In an embodiment, a composite chiplet comprises multiple integrated circuit (IC) components which are each in a different respective one of multiple levels. One or more conductive vias extend through an insulator layer in a first level of the multiple levels. An annular structure of the composite chiplet extends vertically through the insulator layer, and surrounds the one or more conductive vias in the insulator layer. The annular structure mitigates an exposure of the one or more conductive vias to moisture which is in a region of the insulator layer that is not surrounded by the annular structure. In another embodiment, the annular structure further surrounds an IC component which extends in the insulator layer.

15 Claims, 10 Drawing Sheets

(51) Int. Cl.

| | |
|---|---|
| ***H10W 70/60*** | (2026.01) |
| ***H10W 72/00*** | (2026.01) |
| ***H10W 74/01*** | (2026.01) |
| ***H10W 74/10*** | (2026.01) |
| ***H10W 74/43*** | (2026.01) |
| ***H10W 90/00*** | (2026.01) |
| ***H10W 90/22*** | (2026.01) |

(52) U.S. Cl.

CPC .......... *H10W 74/111* (2026.01); *H10W 74/43* (2026.01); *H10W 90/00* (2026.01); *H10W 70/60* (2026.01); *H10W 72/853* (2026.01); *H10W 72/874* (2026.01); *H10W 90/22* (2026.01); *H10W 90/724* (2026.01); *H10W 90/792* (2026.01)

(56) References Cited

U.S. PATENT DOCUMENTS 6,486,954 B1 11/2002 Mieher et al.
6,570,362 B1 5/2003 Estes et al.
7,030,772 B1 4/2006 Lee et al.
8,584,061 B2 11/2013 Shibata et al.
9,219,042 B2 12/2015 Paek et al.
9,275,929 B2 3/2016 Liou et al.
9,324,698 B2 4/2016 Yu et al.
9,368,479 B2 6/2016 Katkar et al.
9,396,997 B2* 7/2016 Hirler .................. H10D 30/668
9,418,967 B2 8/2016 Koshiishi et al.
9,570,399 B2 2/2017 Yang et al.
9,589,945 B2 3/2017 Jo et al.
9,978,694 B2 5/2018 Cho et al.
10,026,715 B2 7/2018 Kume et al.
10,157,892 B1* 12/2018 Chen ..................... H10W 90/00
10,276,544 B2 4/2019 Matsumoto et al.
10,290,571 B2 5/2019 Yu et al.
10,312,201 B1* 6/2019 Hu ........................ H10W 42/00
10,347,598 B2 7/2019 Baek et al.
10,381,298 B2 8/2019 Yu et al.
10,381,326 B2* 8/2019 Woychik ............... H10W 90/00
10,510,650 B2 12/2019 Yu et al.
11,094,672 B2 8/2021 Elsherbini et al.
11,195,817 B2 12/2021 Huang et al.
11,387,222 B2 7/2022 Yu et al.
12,068,234 B2* 8/2024 Chen ................... H10W 70/635
12,272,568 B2 4/2025 Chen et al.
2002/0074649 A1 6/2002 Chrysler et al.
2002/0141155 A1 10/2002 Pinneo
2006/0043367 A1 3/2006 Chang et al.
2006/0113546 A1 6/2006 Sung
2008/0246126 A1 10/2008 Bowles et al.
2009/0134500 A1* 5/2009 Kuo ...................... H10W 90/00 257/659
2009/0174050 A1 7/2009 Bernstein et al.
2012/0061827 A1* 3/2012 Fujita .................... H10W 20/20 257/737
2013/0134548 A1* 5/2013 Torii ..................... H10W 20/20 257/508
2013/0139524 A1 6/2013 Kim et al.
2013/0221493 A1 8/2013 Kim et al.
2013/0250527 A1 9/2013 Hatanaka et al.
2014/0070407 A1* 3/2014 Lee ..................... H10W 70/093 257/737
2014/0231815 A1 8/2014 Railkar et al.
2014/0264772 A1* 9/2014 Horng ................... H10W 42/20 438/510
2014/0293543 A1 10/2014 Kim et al.
2015/0200153 A1 7/2015 Wang et al.
2016/0093533 A1 3/2016 Yow et al.
2017/0084544 A1 3/2017 Chen
2017/0092561 A1 3/2017 Eid et al.
2017/0207197 A1 7/2017 Yu et al.
2017/0213766 A1 7/2017 Kitayama
2018/0158744 A1* 6/2018 Song .................. H10W 74/131
2018/0158749 A1 6/2018 Yu et al.
2018/0240756 A1 8/2018 Foo et al.
2019/0051612 A1* 2/2019 Kim ...................... H10W 42/20
2019/0096868 A1 3/2019 Tsou et al.
2019/0103390 A1 4/2019 Chen et al.
2019/0139896 A1 5/2019 Hsu et al.
2019/0244947 A1 8/2019 Yu et al.
2019/0393190 A1 12/2019 Delacruz et al.
2019/0393192 A1 12/2019 Eid et al.
2019/0393193 A1 12/2019 Eid et al.
2020/0091029 A1 3/2020 Jeng et al.
2020/0105639 A1 4/2020 Valavala et al.
2020/0185330 A1 6/2020 Yu et al.
2020/0211920 A1 7/2020 Lee et al.
2020/0312741 A1 10/2020 Wan et al.
2020/0312774 A1 10/2020 Yu et al.
2020/0335480 A1 10/2020 Hwang et al.
2021/0020601 A1 1/2021 Chen et al.
2021/0066279 A1 3/2021 Yu et al.
2021/0096311 A1 4/2021 Yu et al.
2021/0098422 A1 4/2021 Elsherbini et al.
2021/0118756 A1 4/2021 Wan et al.
2021/0118770 A1 4/2021 Kuo et al.
2021/0159179 A1 5/2021 Elsherbini et al.
2021/0193567 A1 6/2021 Cheah et al.
2021/0375830 A1 12/2021 Elsherbini
2021/0407932 A1* 12/2021 Kabir .................... H10W 42/00
2022/0037281 A1 2/2022 Elsherbini et al.
2022/0157691 A1 5/2022 Sharfi et al.
2022/0310411 A1 9/2022 Chen et al.
2022/0310501 A1 9/2022 Wang et al.
2023/0067349 A1 3/2023 Lin et al.
2023/0115745 A1 4/2023 Wang et al.
2023/0154825 A1 5/2023 Tong
2023/0369070 A1 11/2023 Ho et al.
2024/0008184 A1 1/2024 Kuo et al.
2024/0063142 A1 2/2024 Elsherbini et al.
2024/0153840 A1 5/2024 Jeng et al.
2024/0222215 A1 7/2024 Chen et al.
2025/0349642 A1 11/2025 Wang et al.

OTHER PUBLICATIONS

Bischof, David et al., "Laser-assisted etching of borosilicate glass in potassium hydroxide," Optical Materials Express, vol. 11, No. 4, Apr. 1, 2021, 11 pgs.

Liu, Xue-Qing et al., "Etching-assisted femtosecond laser modification of hard materials," 2019 Institute of Optics and Electronics, Chinese Academy of Sciences, vol. 2, No. 9, pp. 190021-1-190021-14.

* cited by examiner

DEVICE, METHOD, AND SYSTEM TO PROTECT THROUGH-DIELECTRIC VIAS OF A COMPOSITE CHIPLET

BACKGROUND

1. Technical Field

This disclosure generally relates to integrated circuit devices and more particularly, but not exclusively, to mitigating corrosion of interconnect structures of a composite chiplet.

2. Background Art

Monolithic integrated circuit (IC) fabrication has restrictions that may limit a final product's performance, and thus different versions of IC integration are being investigated. To date however, these techniques and architectures generally suffer from certain drawbacks such as high cost, lower insertion efficiency, and increased z-height.

Some IC integration techniques are performed at the package level. In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as a printed circuit board. Multiple chips can be assembled, for example, into a multi-chip package (MCP). Such multi-chip packages may advantageously combine IC chips from heterogeneous silicon processes and/or combine small dis-aggregated chips from the same silicon process. However, there are many challenges with integrating multiple IC chips into such a chip-scale unit. For example, MCP packaging depends on connecting the different IC chips through package routing, or through interposer routing. However, such packaging interconnect suffers from latency and energy efficiency limitations. MCP technology is also currently limited to a relatively small number of die-to-die electrical connections C50-2000 IO/mm of die edge, or about 2 K-80 K connections for an exemplary 10 mm×10 mm die).

Wafer-level stacking is another IC integration technique in which wafers of monolithically fabricated ICs are bonded together. While capable of supporting many more electrical connections (e.g., up to 4 million connections for a 10 mm×10 mm die at 5 μm), wafer-level stacking typically requires IC dies that are substantially the same size (area or footprint), and also suffers compounded yield loss since two dies at a same location within a wafer stack need to be functional. Wafer stacking also typically relies on through substrate vias (TSVs) to support signaling and power between die. TSVs are expensive and have a relatively low density, which can pose a bottleneck in power and/or signal delivery.

Die stacking is another IC integration technique where singulated IC die are stacked after all the metallization layers in the separate IC dies have been completed. Die stacking enables high flexibility since the dies can be individually tested and only known good dies are attached to each other. However, die attach is performed after the thickest chip metallization layers have been fabricated, and such layers do not support very fine pitches. The density of interconnects between the stacked die may therefore be limited. Furthermore, one of the IC chips typically still needs to support TSVs, further limiting interconnect densities across the stack interface.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
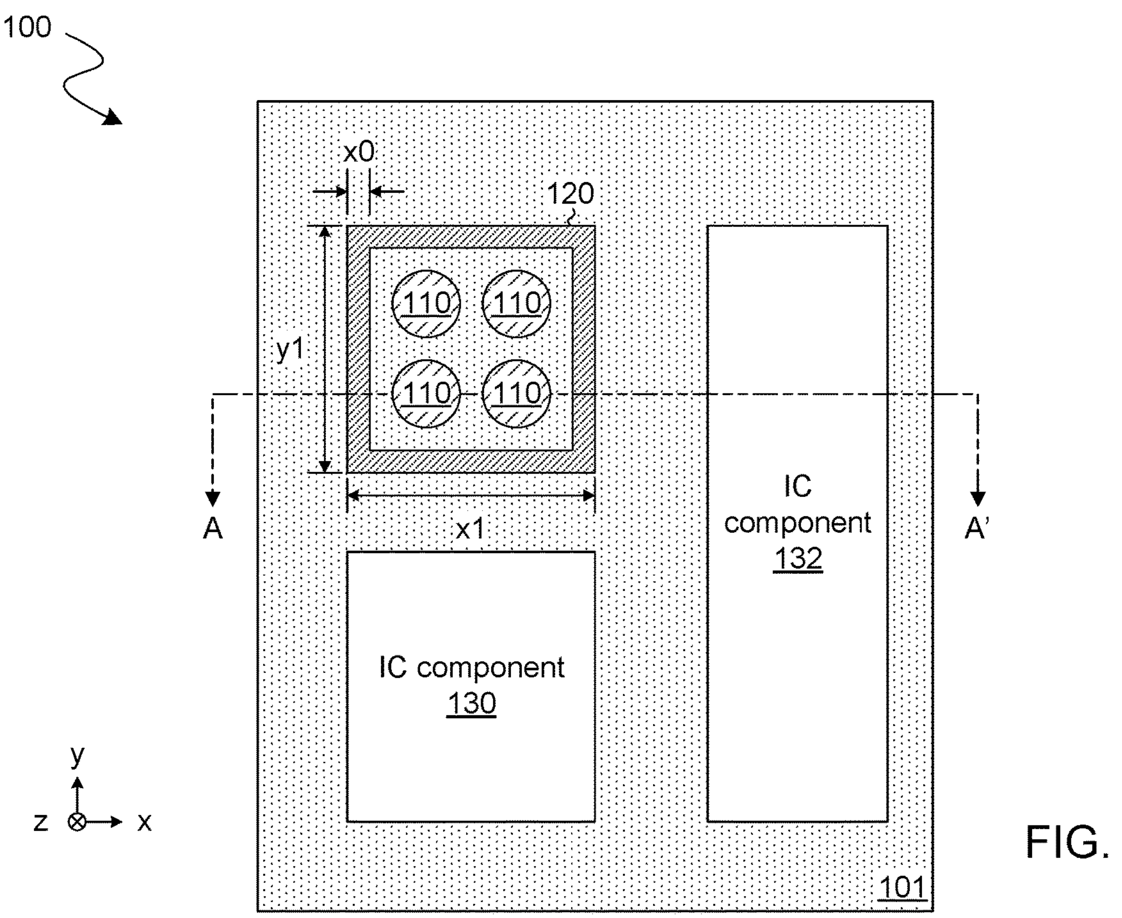
FIGS. 1A, 1B show cross-sectional views each illustrating features of a composite chiplet which comprises a guard ring structure according to an embodiment.

Embodiments described herein variously provide techniques and/or mechanisms to mitigate a risk of corrosion for via structures of a composite chiplet. For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller chiplets electrically coupled by interconnect bridges. The term "chiplet"—also referred to herein as a "tile"—is used herein to refer to a die that is part of an assembly of interconnected dies forming a complete IC in terms of application and/or functionality, such as a memory chip, microprocessor, microcontroller, commodity IC (e.g., chip used for repetitive processing routines, simple tasks, application specific IC, etc.), and system-on-a-chip (SoC). In other words, the chiplets are individual dies connected together to create the functionalities of a monolithic IC. By using separate chiplets, each individual chiplet can be designed and manufactured optimally for a particular functionality. For example, a processor core that contains logic circuits might aim for performance, and thus might require a very speed-optimized layout. This has different manufacturing requirements compared to a USB controller, which is built to meet certain USB standards, rather than for processing speed. Thus, by having different parts of the overall design separated into different chiplets, each one optimized in terms of design and manufacturing, the overall yield and cost of the combined chiplet solution may be improved.

The connectivity between these chiplets is achievable by many different ways. For example, in 2.5D packaging solutions, a silicon interposer and Through Silicon Vias (TSVs) connect dies at silicon interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the chiplets are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omni-directional interconnect (ODI), which allows for top-packaged chips to communicate with other chips horizontally using EMIB and vertically, using Through Mold Vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch.

In one aspect of the present disclosure, an example of quasi-monolithic hierarchical integration of semiconductor dies includes recursively coupling a plurality of chiplets to form composite chiplets of a processing system. The plurality of chiplets may comprise active chiplets and/or passive chiplets, and at least a portion of the plurality of chiplets are coupled using hybrid direct interconnects. As used herein, "hybrid direct bonds" comprise die-to-die (DTD) interconnects with sub 10 micrometer pitch. In other words, the separation between any two hybrid direct bonds is less than or equal to 10 micrometer.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The term "interconnect" may be used to describe any element formed of an electrically conductive material for providing electrical connectivity to one or more components associated with an IC or/and between various such components. In general, the "interconnect" may refer to both conductive traces (also sometimes referred to as "lines") and conductive vias. In general, in context of interconnects, the term "conductive trace" may be used to describe an electrically conductive element isolated by an insulator material (e.g., a low-k dielectric material) that is provided within the plane of an IC die. Such traces are typically stacked into several levels, or several layers, of metallization stacks. On the other hand, the term "via" may be used to describe an electrically conductive element that interconnects two or more traces of different levels. To that end, a via may be provided substantially perpendicularly to the plane of an IC die and may interconnect two traces in adjacent levels or two traces in not adjacent levels. A term "metallization stack" may be used to refer to a stack of one or more interconnects for providing connectivity to different circuit components of an IC chip. Sometimes, traces and vias may be referred to as "conductive traces" and "conductive vias", respectively, to highlight the fact that these elements include electrically conductive materials such as metals.

Interconnects as described herein, in particular interconnects of the IC structures as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer. In another example, the terms "package" and "IC package" are synonymous, as are the terms "die" and "IC die," the term "insulating" means "electrically insulating," the term "conducting" means "electrically conducting," unless otherwise specified.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Figure 1B:
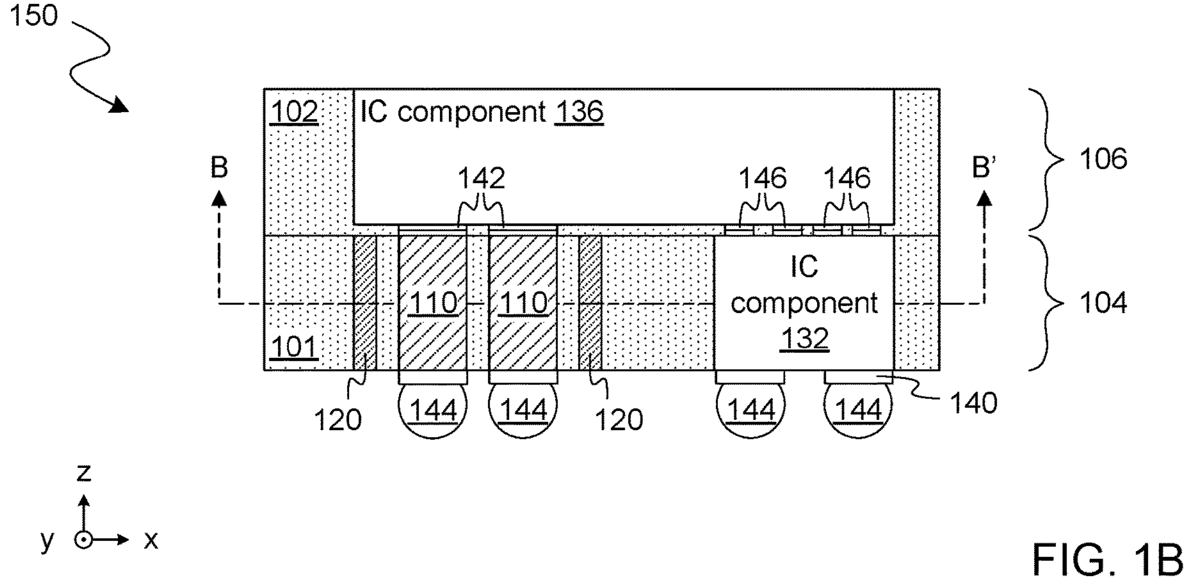

FIG. 1A, 1B shows features of a composite chiplet 100 which comprises a guard ring structure according to an embodiment. More particularly, FIG. 1A shows structures of composite chiplet 100 which are in a horizontal (x-y plane) cross-section BB', whereas FIG. 1B shows a cross-sectional view 150 of composite chiplet 100 in a vertical (z-x plane) section AA'. The composite chiplet 100 illustrates one example of an embodiment wherein one or more interconnect structures extend through a layer of a dielectric material, and wherein an annular structure extends—in a horizontal (x-y) plane—around the one or more one or more interconnect to mitigate a risk of corrosion due (for example) to an absorption of moisture by the dielectric material.

Composite chiplet 100 comprises a plurality of circuit blocks. As used herein, the term "circuit block" refers to an intellectual property (IP) block (also called IP core) comprising an abstract circuit of a reusable unit of logic, cell, or IC layout design with a particular functionality. For example, one or more circuit blocks of composite chiplet 100 each comprise a respective one or more of a set of memory registers, an arithmetic logic unit (ALU), a power converter, a local interconnect block, a global interconnect block and/or the like. However, some embodiments are not limited to a particular one or more functionalities which are to be provided with a given circuit block. A portion of the plurality of circuit blocks may function together as a processing element (PE) in some embodiments. Such a processing element may comprise, for example, some or all of a memory block, an ALU, and a power converter, along with a local interconnect blocks and a global interconnect block.

In various embodiments, composite chiplet 100 facilitates one or more composite PEs, which (for example) can be combined together to form a larger computing structure, which in turn may be further combined to form a larger number of cores. Local interconnect blocks may provide logical coupling between circuit blocks in the same PE, such as between a memory block and an ALU, or between a power converter and an ALU, or between different portions of the ALU. A global interconnect block may provide logical coupling between circuit blocks in different PEs.

In the example embodiment illustrated by FIG. 1A, 1B, one or more circuit blocks and/or processing elements of composite chiplet 100 are provided with IC components 130, 132, 136, which are variously located in two or more levels (e.g., including the illustrative first level 104 and second level 106 shown). In an embodiment, IC components 130, 132, 136 are variously fabricated (partially or fully) separately from each other—e.g., wherein IC components 130, 132 and 136 are then singulated each from a respective wafer, and variously transferred into position for inclusion in composite chiplet 100. The particular number and/or arrangement of IC components 130, 132, 136 is merely illustrative, and composite chiplet 100 alternatively includes more or fewer IC components in other embodiments—e.g., wherein composite chiplet 100 further comprises one or more additional levels below first level 104, and/or one or more additional levels above second level 106.

In some embodiments, one or more IC components 130, 132, 136 may comprise ultrasmall semiconductor dies called microchiplets with footprint less than 10 $mm^2$. In some other embodiments, one or more IC components 130, 132, 136 may comprise semiconductor dies of any size. In yet other embodiments, one or more IC components 130, 132, 136 may comprise other composite chiplets in a recursive arrangement. In some embodiments, one or more IC components 130, 132, 136 may comprise a plurality of semiconductor dies stacked one on top of another, electrically coupled with hybrid direct bonds.

In some embodiments (e.g., as shown), a PE is embodied as a portion of composite chiplet 100. In other embodiments, multiple PEs are embodied each in a separate composite chiplet 100. In the example embodiment shown, first circuit blocks may be embodied in separate dies comprising IC components 130, 132 located at first level 104—e.g., wherein a second one or more circuit blocks may be embodied in a die comprising IC component 136 located at second level 106.

Any suitable combination, layout, configuration, or arrangement of various circuit blocks and processing elements (and corresponding IC components such as IC components 130, 132, 136) may be used within the broad scope of the embodiments of the present disclosure. For example, multiple such composite chiplets may be stacked within a single package. Composite chiplet 100 may comprise an IC, such as a microprocessor, in some embodiments.

In other embodiments, composite chiplet 100 may form a portion (e.g., system controller block) of a larger IC, such as a microprocessor, a central processing unit (CPU), a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express circuitry, Double Data Rate transfer circuitry, or other electronic components known in the art In the example embodiment shown, IC components 130, 132 are variously disposed in a layer of an insulator 101 of first level 104, wherein IC component 136 is disposed in a layer of an insulator 102 of second level 106. Insulator 101 and/or insulator 102 comprise any of various suitable inorganic (or other) materials the provide electrical insulation. Examples of such materials include, but not limited to, silicon, silicon dioxide, silicon nitride, silicon carbide, aluminum oxide or any of various combinations thereof. For example, insulator 101 and/or insulator 102 comprises an oxide, in various embodiments. In some embodiments, a (z-axis) thickness of insulator 101—or of insulator 102—is in a range of 5-80 microns (um), for example.

Signal and/or power to circuitry of a given IC component in one level of composite chiplet 100 may be routed through one or more conductive via structures (referred to herein as "through-connections") that extend through an insulator layer of another level. For example, through-connections 110 of composite chiplet 100 each illustrate a type of interconnect (also referred to herein as a "through dielectric via", or "TDV") which extends to facilitate electrical connectivity through a level of a composite chiplet or other such quasi-monolithic chip structure. In the example embodiment shown, through-connections 110 variously extend through insulator 101 to provide electrical connectivity between IC component 136 (or other circuit structures of second level 106) and a respective one of various bond pads 140 which are at a bottom side of first level 104. For example, hybrid bonds (or other suitable electrical coupling) between through-connections 110 and IC component 136 are provided with bond pads 142—e.g., wherein other hybrid bonds between IC component 132 and IC component 136 are provided with bond pads 146. In one such embodiment, bond pads 140 facilitate coupling of composite chiplet 100 to an underlying organic substrate, circuit board, or other suitable device—e.g., via the illustrative microbumps 144 shown. In an alternative embodiment, bond pads 140 facilitate hybrid bonds (or other suitable electrical coupling) between first level 104 and another level (not shown) of composite chiplet 100.

Through-connections 110 comprise any of various suitable conductive materials including, but not limited to, copper (Cu), aluminum (Al), cobalt (Co), tin (Sn), titanium (Ti), or any of various combinations thereof. A given one of through-connections 110 has a cross-sectional profile—in a horizontal (x-y) plane—which, for example, is substantially circular, elliptical, rectangular or square. By way of illustration and not limitation, a given one of through-connections 110 has a radius (in an x-y plane) which is in a range of 0.4 um to 9 um. The particular number and arrangement of through-connections 110 is merely illustrative—e.g., wherein other embodiments include more, fewer, and/or differently arranged TDVs in first level 104, in second level 106 or in another level (not shown) of composite chiplet 100.

Note that FIGS. 1A, 1B are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIGS. 1A, 1B may include multiple dies and/or XPUs along with other electrical components.

Additionally, although some components of the assemblies are illustrated in FIGS. 1A, 1B as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Some embodiments variously provide structures to mitigate the possibility of corrosion to via structures (such as through-connections 110) which extend through an insulator layer in a given level of a composite chiplet.

Such corrosion is otherwise prone to take place due to an insulator material absorbing or otherwise including moisture—e.g., during fabrication processing and/or during in-field use. For example, some inorganic oxide materials (such as silicon dioxide) are relatively prone to absorbing moisture—e.g., as compared to various inorganic nitride materials and/or various metals. Some embodiments variously provide an annular structure (also referred to herein as a "ring structure," or "guard ring") which, in a horizontal (x-y) plane, extends around one or more TDVs in a given level of composite chiplet 100. In one such embodiment, the annular structure extends vertically through the same insulator layer of that given layer, thus mitigating an exposure of the one or more TDVs to moisture which is outside of the region surrounded by the annular structure.

By way of illustration and not limitation, first level 104 further comprises an annular structure 120 which extends, along the z-axis shown, at least partially through insulator 101, and which—in a horizontal (x-y) plane—extends around some or all of the through-connections 110 in first level 104. Annular structure 120 comprises any of various materials which are suitable to provide a moisture barrier—e.g., wherein the material of annular structure 120 exhibits a relatively low rate of moisture transmission, as compared to the insulator 101 in which annular structure 120 is disposed. In some embodiments, annular structure 120 comprises any of various suitable metal materials such as Cu, Sn, etc. —e.g., wherein annular structure 120 and through-connections 110 comprise the same metal. In other embodiments, annular structure 120 comprises any of various suitable non-metallic materials, such as SiN, SiCN or the like, which are relatively more resistant to moisture transmission than the insulator 101.

Composite chiplet 100 illustrates one example embodiment wherein a guard ring surrounds only one or more TDVs. For example, any chiplets (e.g., including IC component 130 and IC component 132) of first level 104 are outside of the region which is surrounded by annular structure 120. However, in an alternative embodiment, a guard ring further extends to surround some or all chiplets of a level, in addition to surrounding one or more TDVs of that level.

In some embodiments, annular structure 120 comprises only one single barrier material. In other embodiments, annular structure 120 comprises multiple layers (not shown) of different respective materials—e.g., where each such layer surrounds, or is surrounded by, another one of the multiple layers. In an illustrative scenario according to one embodiment, annular structure 120 comprises successive layers of SiN, $SiO_2$, and TaN, for example. In another illustrative embodiment, annular structure 120 comprises successive layers of SiN, $SiO_2$, and Ti (or Ta), for example.

In one example embodiment, an average minimum thickness x0 of annular structure 120 is at least 50 nanometers (nm). For example, thickness x0 is in a range of 0.5 to 25 um—e.g., wherein horizontal dimensions x1, y1 of annular structure 120 are each at least 10 um. However, other embodiments are not limited with respect to the particular values of one or more of x0, x1, y1. In the example embodiment shown, a cross-sectional profile of annular structure 120 in a horizontal (x-y) plane has a substantially rectilinear shape. However, in other embodiments, such a profile instead has any of various circular, elliptical, or other shapes.

Figure 2A:
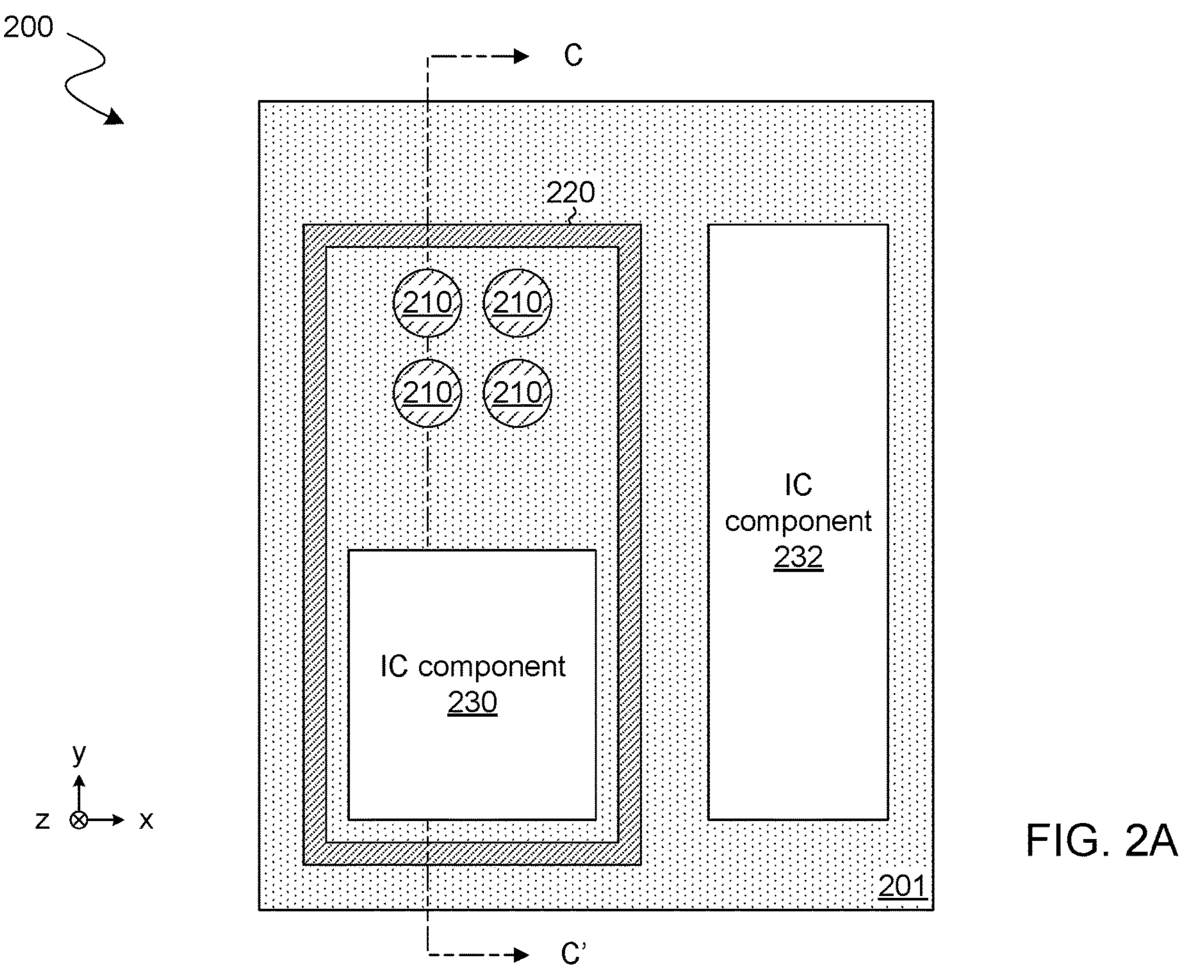
FIGS. 2A, 2B show cross-sectional views each illustrating features of a composite chiplet which provides protection of interconnect structures according to an embodiment.
Figure 2B:
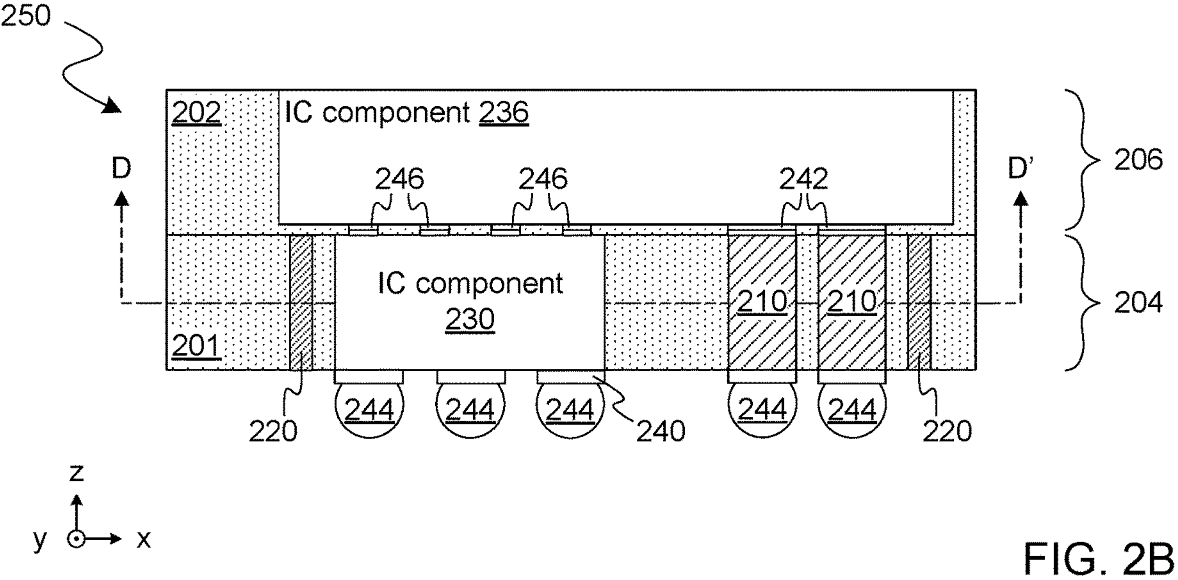

FIGS. 2A, 2B show features of a composite chiplet 200 which provides protection of interconnect structures according to an embodiment. More particularly, FIG. 2A shows structures of composite chiplet 200 which are in a horizontal (x-y plane) cross-section DD', whereas FIG. 2B shows a cross-sectional view 250 of composite chiplet 200 in a vertical (z-x plane) section CC'. Composite chiplet 200 illustrates one example of an embodiment wherein an annular guard ring structure extends around one or more TDVs, and further extends around one or more circuit components other than any TDV. In some embodiments, composite chiplet 200 has features of composite chiplet 100 (for example).

As shown in FIG. 2A, 2B, composite chiplet 200 comprises multiple IC components (e.g., including multiple chiplets) which are variously located each in a respective one of multiple levels of composite chiplet 200. For example, IC components 230, 232 are located each in a first level 204, and another IC component 236 is located in a second level 206 over first level 204—e.g., wherein IC components 230, 232, 236 correspond functionally to IC components 130, 132, 136 (respectively).

IC components 230, 232 are variously disposed in (and extend vertically through) a layer of an insulator 201 of first level 204, wherein IC component 236 is disposed in (and extends vertically through) a layer of an insulator 202 of second level 206. In an embodiment, insulator 201 and insulator 202 have respective features of insulator 101 and insulator 102 (for example).

One or more via structures of composite chiplet 200 (e.g., including the illustrative through-connections 210 shown) variously extend vertically each through a respective one of levels 204, 206 (or any other such level of composite chiplet 200). By way of illustration and not limitation, through-connections 210 variously extend through insulator 201 to provide electrical connectivity between IC component 236 and a respective one of various bond pads 240 which are at a bottom side of first level 204. Hybrid bonds (for example) between through-connections 210 and IC component 236 are provided with bond pads 242—e.g., wherein other hybrid bonds between IC component 230 and IC component 236 are provided with bond pads 246. In one such embodiment, bond pads 240 facilitate coupling of composite chiplet 200 to an underlying organic substrate, circuit board, or other suitable device—e.g., via the illustrative microbumps 244 shown. In an alternative embodiment, bond pads 240 facilitate hybrid bonds (or other suitable electrical coupling) between first level 204 and another level (not shown) of composite chiplet 200—e.g., wherein microbumps 244 are omitted.

To mitigate corrosion of some or all of through-connections 210, and of other structures in first level 204, composite chiplet 200 further comprises an annular structure 220 which extends, along the z-axis shown, at least partially through insulator 201. In a horizontal (x-y) plane, annular structure 220 surrounds a region comprising various structures which are to be protected—e.g., wherein said region includes through-connections 210 and (for example) IC component 230. Annular structure 220 comprises features of annular structure 120, for example.

In some embodiments, annular structure 220 surrounds some, but not all, chiplets and/or other circuit structures in first level 204. For example, IC component 232 is outside of the region which is surrounded by annular structure 220. In one such embodiment, one or more other TDVs (not shown) of first level 204 are also outside of said region. In various embodiments, composite chiplet 200 further comprises one or more additional annular structures (not shown) which similarly provide corrosion mitigation functionality such as that of annular structure 220. By way of illustration and not limitation, in some embodiments, another annular structure (not shown) extends around one or more TDVs in first level 204 or, alternatively, in second level 206.

Figure 3:
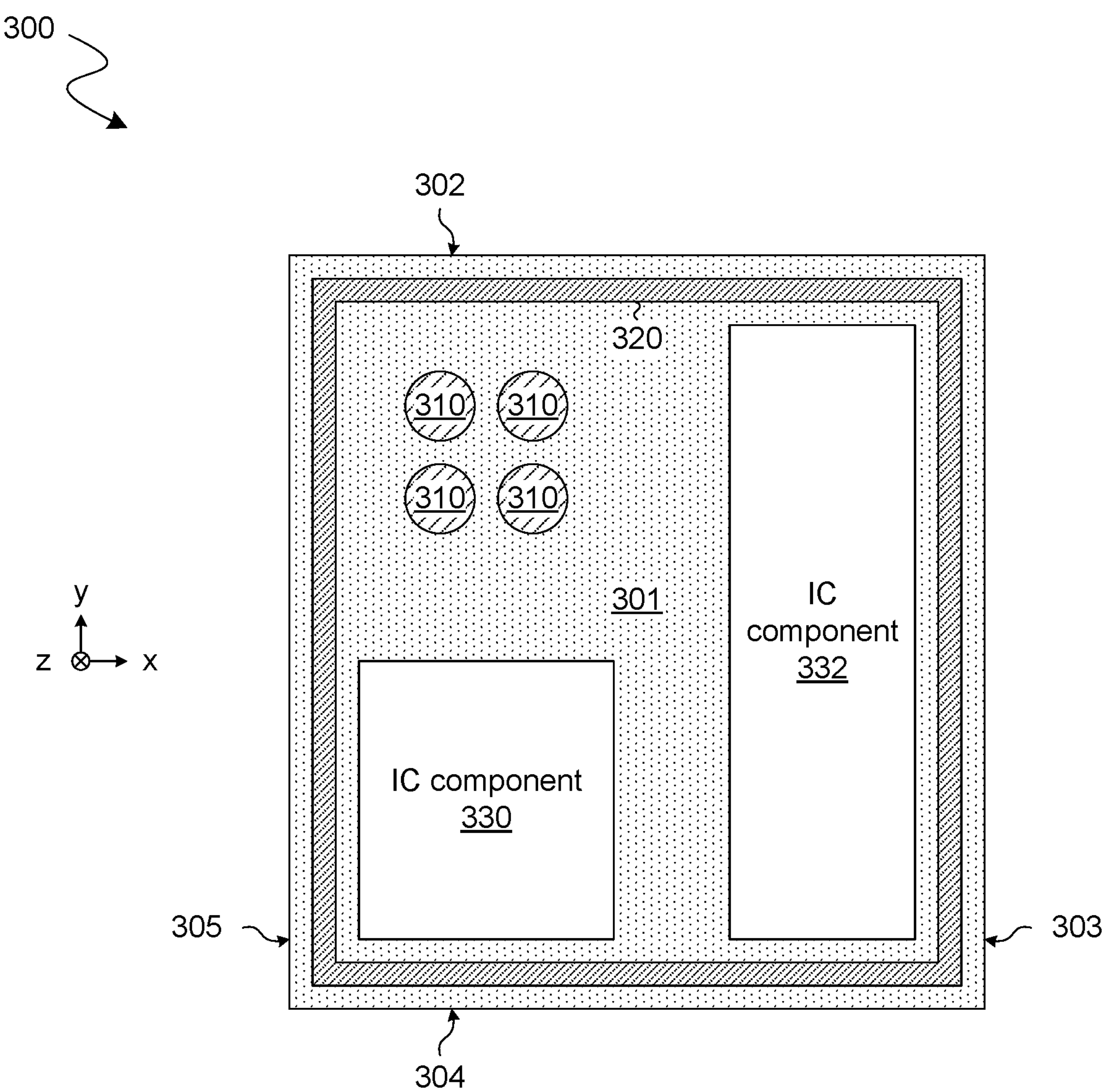
FIG. 3 shows a cross-sectional view illustrating features of a composite chiplet wherein one layer comprises components which are surrounded by an annular guard structure according to an embodiment.

FIG. 3 shows features of a composite chiplet 300 wherein one layer comprises circuit structures which are surrounded by an annular guard structure according to an embodiment. Composite chiplet 300 illustrates one example of an embodiment wherein an annular guard ring structure extends around all circuit structures, including one or more TDVs, in a given level of a composite chiplet. In some embodiments, composite chiplet 300 has features of one of composite chiplets 100, 200 (for example).

As shown in FIG. 3, composite chiplet 300 comprises IC components 330, 332 (e.g., chiplets) which variously extend through a layer of an insulator 301 in a first level of composite chiplet 300—e.g., wherein one or more other IC components are located in a second level (not shown) which is above, or below, the first level. For example, IC components 330, 332 correspond functionally to IC components 130, 132 (respectively)—e.g., wherein insulator 301 corresponds to one of insulators 101, 102. One or more TDV structures—e.g., including the illustrative through-connections 310 shown—variously extend through insulator 301 to provide electrical connectivity between circuit structures which are on opposite respective sides of the first level. For example, through-connections 310 provide functionality such as that of through-connections 110 or through-connections 210.

In various embodiments, composite chiplet 300 further comprises an annular structure 320 to mitigate corrosion of through-connections 310 and of the other structures which are in the first level. In one such embodiment, annular structure 320 extends (along the z-axis shown) to opposite sides of the insulator 301. Furthermore, in a horizontal (x-y) plane, annular structure 320 surrounds all circuit structures which are at least partially in the first level. By way of illustration and not limitation, annular structure 320 extends around each of through-connections 310, as well as around both of IC components 330, 332. For example, any TDV, chiplet or other circuitry which extends in the first level is in a region which is surrounded by annular structure 320—e.g., wherein only portions of insulator 301 are between annular structure 320 and the various sides 302, 303, 304, 305 of the first level. Annular structure 320 provides functionality such as that of one of annular structures 120, 220, for example.

Figure 4:
FIG. 4 shows a cross-sectional view illustrating features of a composite chiplet which comprises multiple guard ring structures according to an embodiment.
Figure 4:
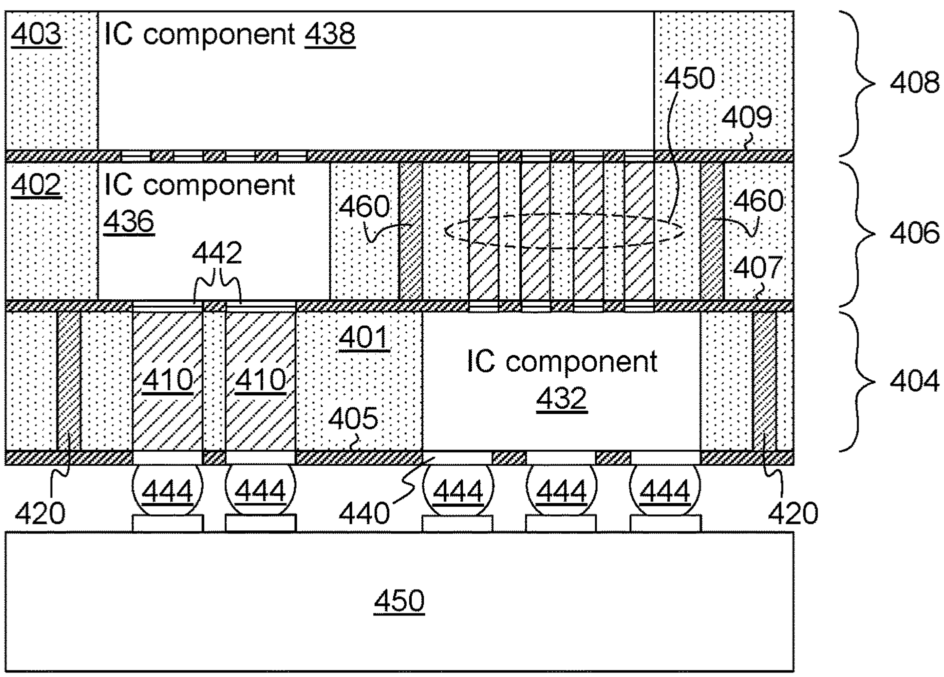
Figure 4:
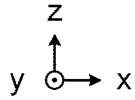

FIG. 4 shows features of a composite chiplet 400 which comprises multiple guard ring structures according to an embodiment. Composite chiplet 400 illustrates one example of an embodiment wherein annular guard ring structures each extend around a respective one or more TDVs, wherein two or more such annular guard ring structures are in different respective vertical levels. In some embodiments, composite chiplet 400 has features of one of composite chiplets 100, 200, 300 (for example).

As shown in FIG. 4 composite chiplet 400 comprises IC components 432, 436, 438 (e.g., chiplets) which are in a first level 404, a second level 406, and a third level 408 (respectively) of composite chiplet 400. For example, IC components 432, 436, 438 provide functionality such as that of IC components 130, 132, 136, in some embodiments. IC component 432 is disposed in (and extends vertically through) a layer of an insulator 401 of first level 404, wherein IC component 436 is disposed in a layer of an insulator 402 of second level 406, and IC component 438 is disposed in a layer of an insulator 403 of third level 408. In an embodiment, insulators 401, 402, 403 have features of insulators 101, 102 (for example).

One or more TDVs (e.g., including the illustrative through-connections 410 shown) variously extend through insulator 401 to facilitate electrical connectivity between IC component 436 and one or more of various bond pads 440 which are at a bottom side of first level 404. In one such embodiment, bond pads 440 facilitate coupling of composite chiplet 400 to an underlying substrate 450—e.g., an organic substrate, or printed circuit board—via the illustrative microbumps 444 shown.

Alternatively or in addition, one or more other TDVs (such as the illustrative through-connections 450 shown) variously extend through insulator 402 to facilitate electrical connectivity between levels 404, 408. For example, in one embodiment, some or all of through-connections 450 are variously coupled between IC components 432, 438.

In one such embodiment, chiplet 400 further comprises an annular structure 420 (viewed in cross-section in FIG. 4) which is to mitigate corrosion of some or all of through-connections 410, and of other structures in first level 404. For example, annular structure 420 extends vertically through insulator 401, and further surrounds a region in which through-connections 410 and (for example) IC component 432 are located. Furthermore, another annular structure 460 of chiplet 400 (also viewed in cross-section) similarly mitigates corrosion of some or all of through-connections 450. In the example embodiment shown, annular structure 460 extends vertically through insulator 402, and further surrounds a region in which through-connections 450 are located.

Although some embodiments are not limited in this regard, composite chiplet 400 comprises additional barrier structures to mitigate moisture intrusion into some or all of insulators 401, 402, 403. By way of illustration and not limitation, composite chiplet 400 comprises a non-metallic barrier layer 405 which extends under insulator 401. For example, non-metallic barrier layer 405 is patterned to adjoin a bottom side of insulator 401, but to leave exposed bond pads 440 and/or other conductive contacts which facilitate electrical connectivity between composite chiplet

400 and through-connections 450. In various embodiments, non-metallic barrier layer 405 comprises a non-metallic material such as one which forms annular structure 120 (for example). In one such embodiment, the non-metallic material of non-metallic barrier layer 405 is the same as a non-metallic material of one of annular structures 420, 460.

In some embodiments, composite chiplet 400 further comprises a non-metallic barrier layer 407 which extends between insulators 401, 402. For example, non-metallic barrier layer 407 is patterned to adjoin one or each of insulators 401, 402, but to leave exposed bond pads 442 and/or other conductive contacts which facilitate electrical connectivity between various respective circuit structures of levels 404, 406. In one such embodiment, non-metallic barrier layers 405, 407 mitigate the risk of moisture absorption by insulator 401.

Alternatively or in addition, composite chiplet 400 further comprises another non-metallic barrier layer 409 which extends between insulators 402, 403. In one such embodiment, non-metallic barrier layer 409 is patterned to adjoin one or each of insulators 402, 403, but to leave exposed conductive contacts which facilitate electrical connectivity between various respective circuit structures of levels 406, 408. In one such embodiment, non-metallic barrier layers 407, 409 mitigate the risk of moisture absorption by insulator 402. In various embodiments, some or all of non-metallic barrier layers 405, 407, 409 each comprise respective a non-metallic material such as one which forms annular structure 120—e.g., wherein the non-metallic material comprises silicon nitride. In some embodiments, a thickness (z-axis dimension) of a given one of layers 405, 407, 409 is at least 50 nm.

Figure 5:
FIG. 5 shows a cross-sectional view illustrating features of a composite chiplet comprising guard ring structures which mitigate corrosion of one or more interconnect structures according to an embodiment.
Figure 5:
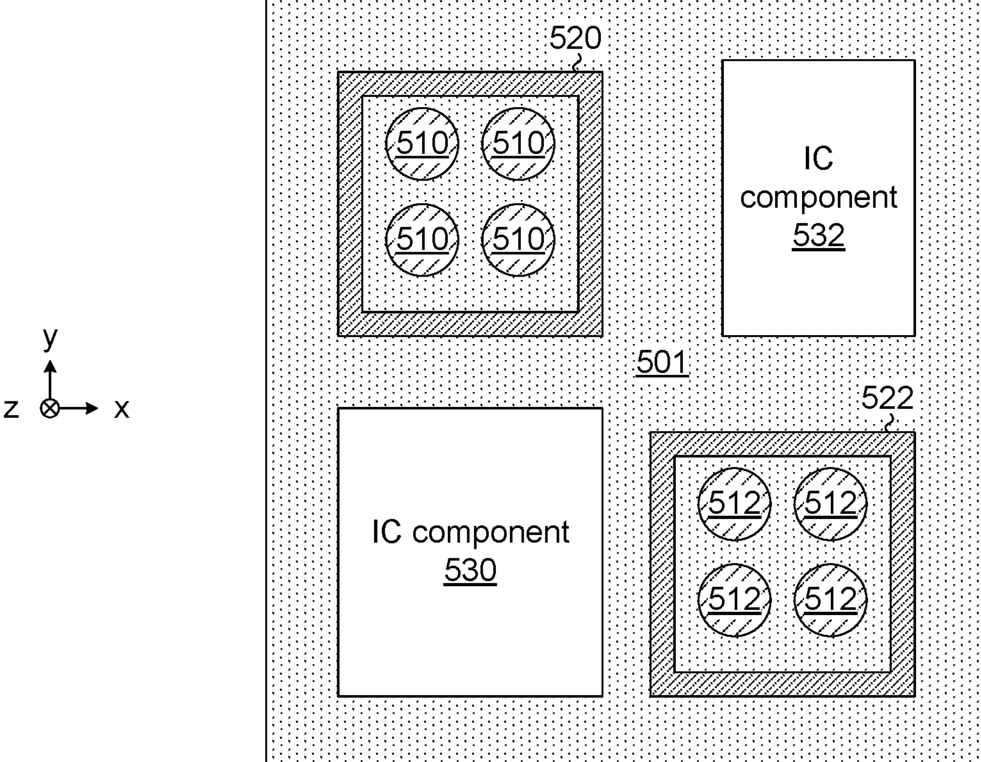

FIG. 5 shows features of a composite chiplet 500 comprising guard ring structures which mitigate corrosion of one or more interconnect structures according to an embodiment. Composite chiplet 500 illustrates one example of an embodiment wherein annular guard ring structures each extend around different respective TDVs which are in the same layer. In some embodiments, composite chiplet 500 has features of one of composite chiplets 100, 200, 300, 400 (for example).

As shown in FIG. 5, composite chiplet 500 comprises IC components 530, 532 (e.g., chiplets) which variously extend through a layer of an insulator 501 in a first one of multiple levels of composite chiplet 500. One or more TDV structures—e.g., including the illustrative through-connections 510 and through-connections 520 shown—variously extend through insulator 501 to provide electrical connectivity between circuit structures which are on opposite respective sides of the first level. For example, through-connections 510, 520 provide functionality such as that of through-connections 110, through-connections 210, or through-connections 410.

In various embodiments, composite chiplet 500 further comprises an annular structure 520 to mitigate corrosion of through-connections 510, 520. Annular structure 520 extends vertically (along the z-axis shown) to opposite sides of the insulator 501, and in a horizontal (x-y) plane, surrounds through-connections 510. Similarly, another annular structure 522 in the first level extends vertically to opposite sides of the insulator 501, and in a horizontal (x-y) plane, surrounds through-connections 520. One or each of annular structures 520, 522 provides functionality similar to that of one of annular structures 120, 220, 320, 420, 460, for example.

Figure 6:
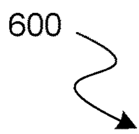
FIG. 6 shows a flow diagram illustrating features of a method to provide structures of a composite chiplet according to an embodiment.
Figure 6:
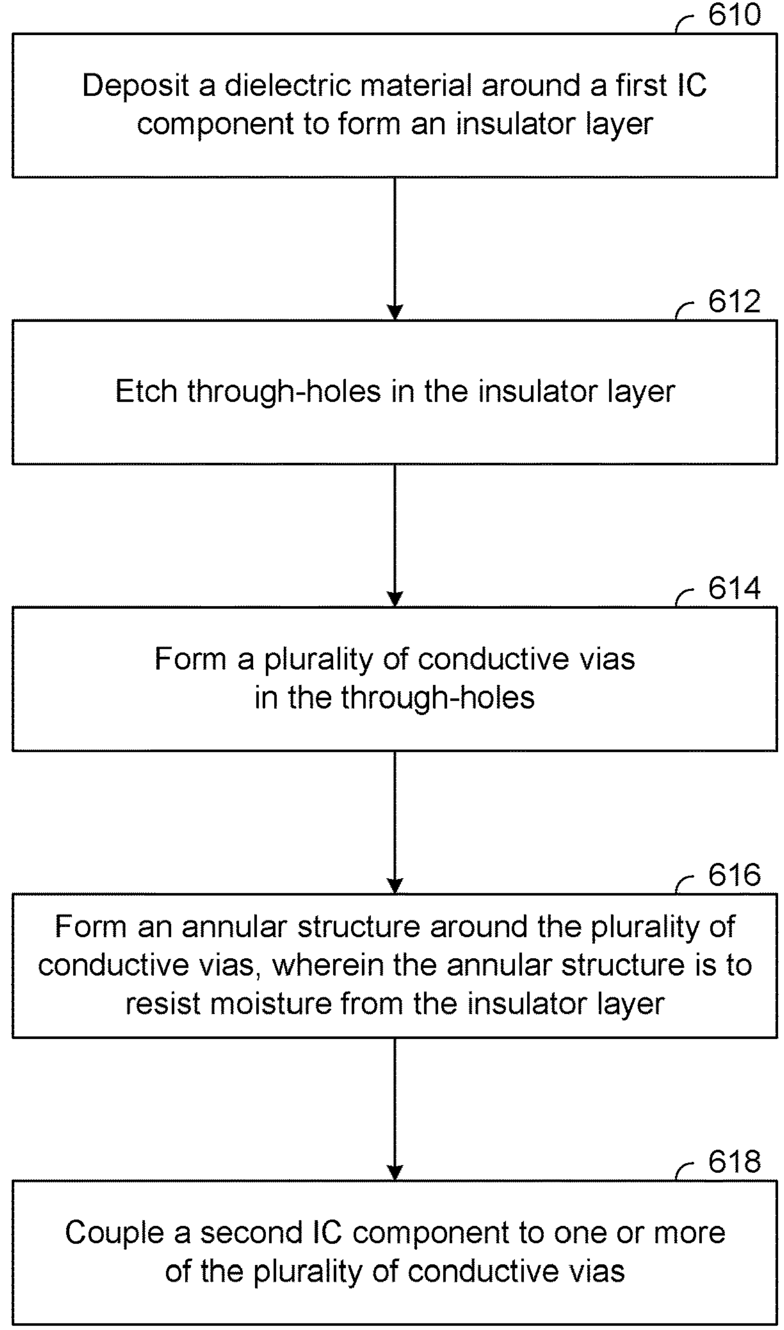

FIG. 6 shows features of a method 600 provide structures of a composite chiplet according to an embodiment. In various embodiments, method 600 is performed to provide structures of one of the composite chiplets 100, 200, 300, 400, 500. To illustrate certain features of various embodiments, method 600 is described herein with reference to structures provided during processing which is illustrated in FIGS. 7A-7G. However, in other embodiments, method 600 is performed to provide any of various other structures, as described herein.

Figure 7A:
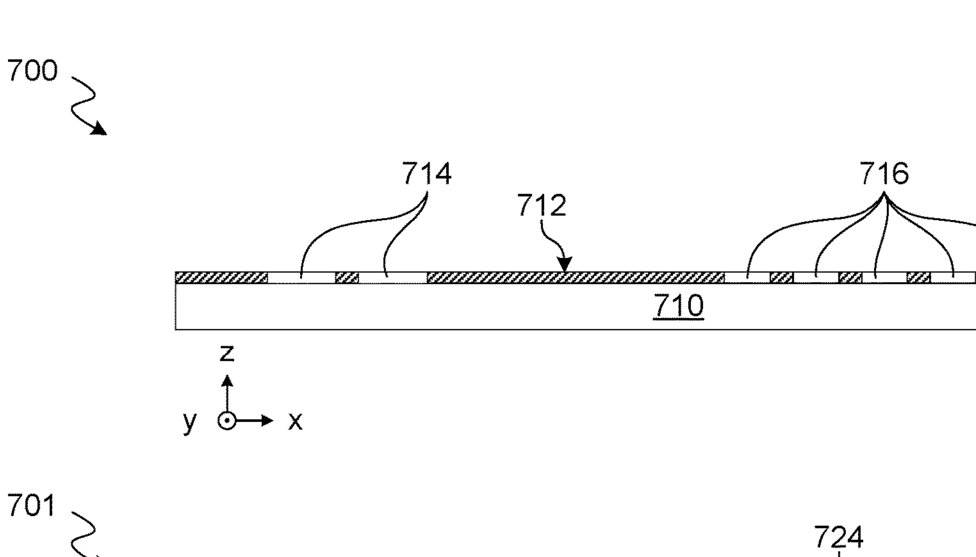
FIGS. 7A through 7G show cross-sectional views each illustrating features during a respective stage of processing which is provide structures of a composite chiplet according to an embodiment.

As shown in FIG. 6, method 600 comprises (at 610) depositing a dielectric material—e.g., an inorganic oxide (or other) dielectric such as silicon dioxide—around an integrated circuit (IC) component to form an insulator layer. For example, FIG. 7A through 7G show features during respective stages 700 through 706 of processing to provide structures of a composite chiplet according to an embodiment. In various embodiments, processing such as that illustrated by stages 700 through 706 include some or all of method 600 (for example) and/or is performed to provide structures such as those of one of composite chiplets 100, 200, 300, 400, 500. As shown in FIG. 7A, during stage 700, a patterned layer of a moisture barrier material 712 is deposited on an underlying structure (illustrated by substrate 710) such as a carrier wafer, an underlying level of the composite chiplet, or the like. In an embodiment, a sequence of lithographic, etch, metallization, planarization and/or other operations result in the formation of various conductive contacts 714, 716 which extend through barrier material 712

Figure 7B:
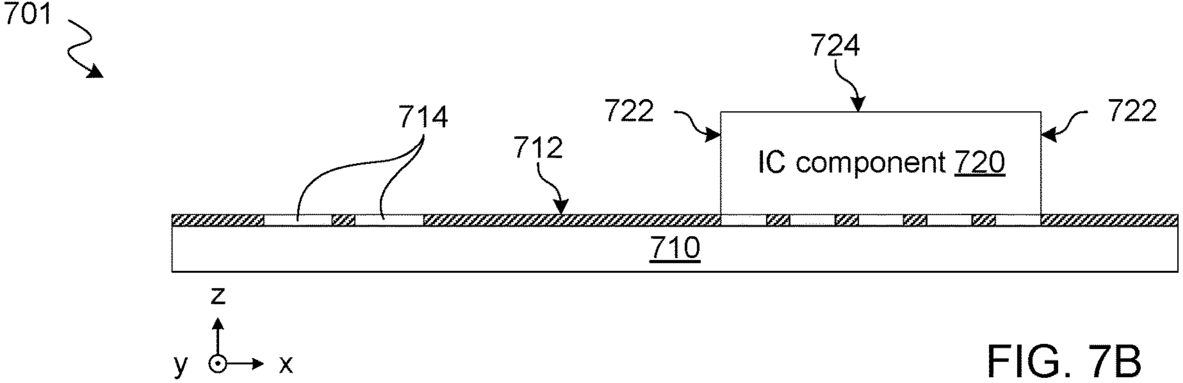
Figure 7C:
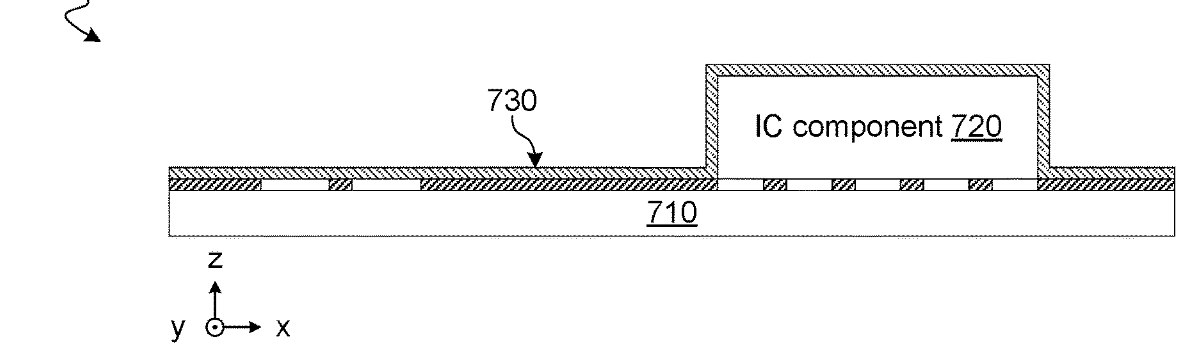
Figure 7C:
Figure 7D:
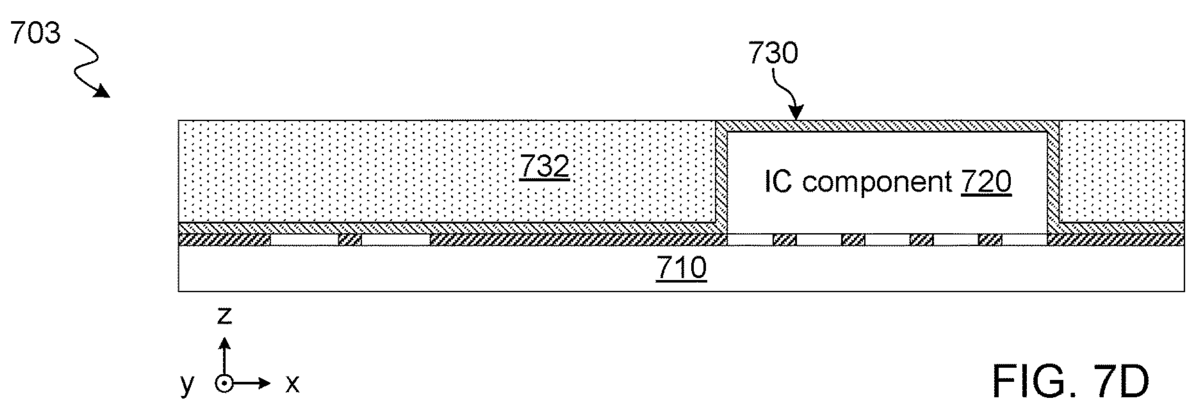

At the stage 701 shown in FIG. 7B, die assembly processing results in an IC component 720 (e.g., a chiplet) being hybrid bonded or otherwise coupled to conductive contacts 716. Afterward, at the stage 702 shown in FIG. 7C, an additional layer of a moisture barrier material 730 is deposited (for example) over barrier material 712, conductive contacts 714, along sidewall structures 722 of IC component 720, and on a top surface 724 of IC component 720. Subsequently, at the stage 703 shown in FIG. 7D, deposition and planarization of an oxide material result in the formation of an insulator layer 732 which (for example) surrounds IC component 720.

Referring again to FIG. 6, method 600 further comprises (at 612) etching through-holes in the insulator layer which is formed at 610. Afterward (at 614), method 600 performs a metallization process to form a plurality of conductive vias which are each in a different respective one of the through-holes. Furthermore, method 600 (at 616) forms an annular structure which extends through the insulator layer.

In an embodiment, the annular structure formed at 616 surrounds the plurality of conductive vias in the insulator layer—e.g., wherein the annular structure is to prevent or otherwise mitigate an intrusion of moisture from a portion of the insulator layer which is not surrounded by the annular structure to a second portion of the insulator layer which is surrounded by the annular structure.

For example, the annular structure formed at 616 comprises a copper (Cu), tin (Sn) or any of various other suitable metals—e.g., wherein the annular structure and the plurality of conductive vias each comprise the same metal. In other embodiments, the annular structure comprises a non-metallic dielectric which, as compared to the dielectric material of the insulator layer, is more resistant to moisture transmission. For example, in one such embodiment, the insulator layer comprises an oxide, and the annular structure comprises a nitride. In various embodiments, the annular structure comprises multiple layers which are each of a different respective non-metallic dielectric material, wherein the each of the multiple layers surrounds, or is surrounded by, a respective other one of the multiple layers.

In some embodiments, the annular structure formed at 616 further surrounds the IC component and/or any of various other circuit structures in a first level of the composite chiplet (wherein the first level is to comprise the insulator layer, the IC component, the plurality of conductive vias, and the annular structure). In one such embodiment, the annular structure surrounds all circuit structures which extend in the insulator layer.

Figure 7E:
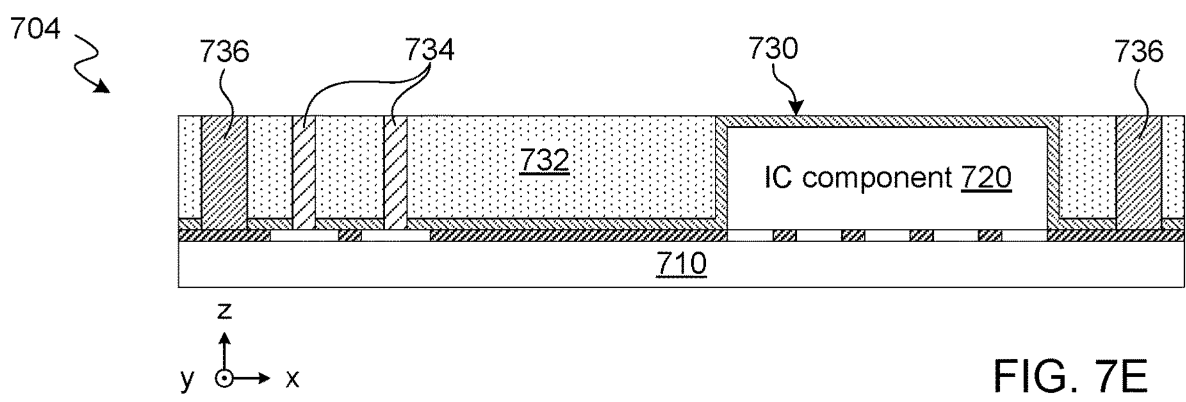

By way of illustration and not limitation, at the stage 704 shown in FIG. 7E, a sequence of lithographic, etch, metallization, planarization and/or other operations results in the formation of through-dielectric vias (TDVs) 734 which variously extend though insulator layer 732. The sequence further forms an annular structure 736 which also extends though insulator layer 732, wherein the annular structure 736 surrounds the TDVs 734 in insulator layer 732. In one such embodiment, annular structure 736 also surrounds IC component 720, although other embodiments are not limited in this regard.

In some embodiments, method 600 further comprises forming a first patterned layer at a first side of the insulator layer (e.g., the first patterned layer comprising respective portions of barrier material 712 and barrier material 730), and further forming a second patterned layer at a second side of the insulator layer, wherein the second side is opposite the first side. In one such embodiment, the first patterned layer and the second patterned layer each comprise a respective non-metallic material to resist an absorption of moisture by the insulator layer. In one such embodiment, method 600 further comprises forming an additional moisture barrier structure which extends along a sidewall of the IC component to one of the first patterned layer or the second patterned layer.

Figure 7F:
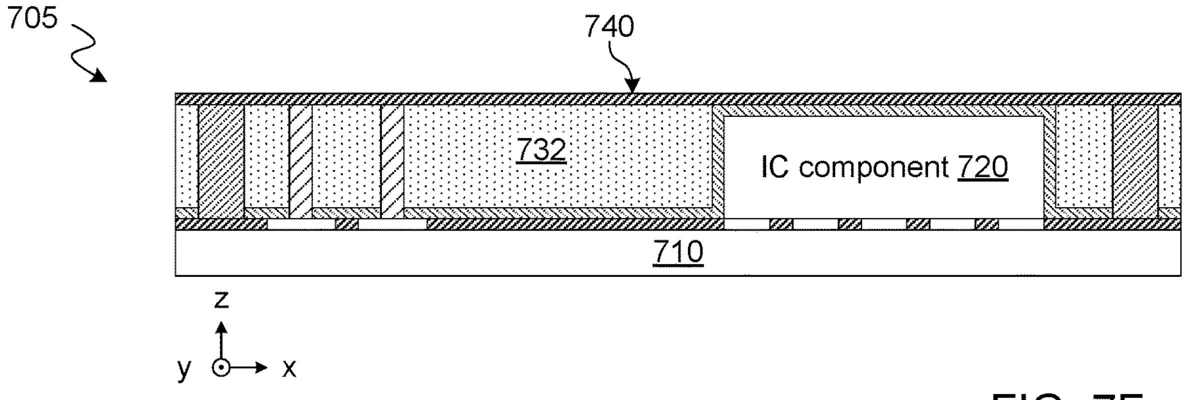
Figure 7G:
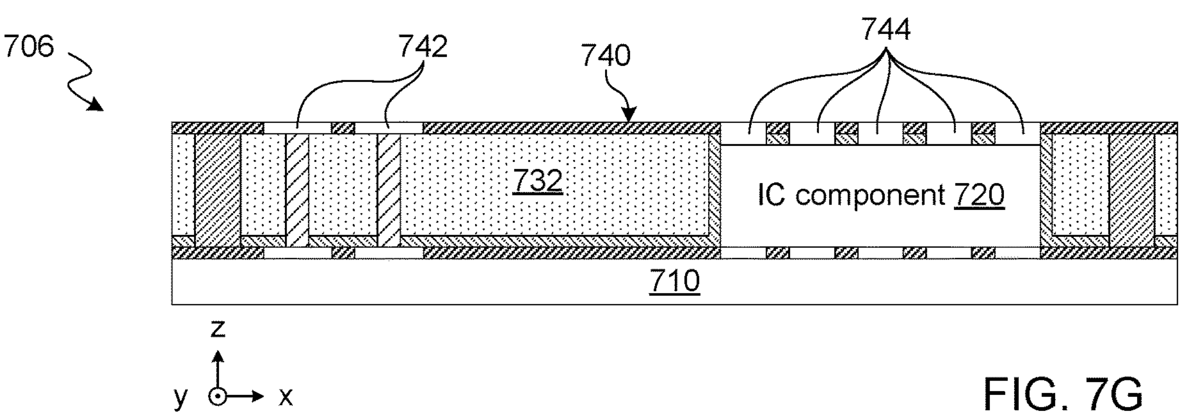

By way of illustration and not limitation, at the stage 705 shown in FIG. 7F, an additional layer of a moisture barrier material 740 is deposited over insulator layer 732 and IC component 720—e.g., wherein barrier material 740 includes a material which is also present in barrier material 712 and/or of barrier material 730. Subsequently, at the stage 706 shown in FIG. 7G, additional lithographic, etch, metallization, planarization and/or other operations are performed to form (for example) conductive contacts 742 on TDVs 734, and/or conductive contacts 744 on IC component 720.

Referring again to FIG. 6, method 600 further comprises (at 618) coupling a second IC component to one or more of the plurality of conductive vias, wherein a second level of the composite chiplet is to comprise the second IC component. In one such embodiment, method 600 further comprises additional processing (not shown) to provide another annular structure in the second level. By way of illustration and not limitation, such additional processing comprises depositing a second dielectric material around the second IC component to form a second insulator layer, and etching second through-holes in the second insulator layer. Subsequently, the additional processing forms a second plurality of conductive vias in the second through-holes, and further forms a second annular structure which extends through the second insulator layer, and around the second plurality of conductive vias.

In some embodiments, method 600 additionally or alternatively comprises other processing (not shown) to provide another annular structure in the first level of the composite chiplet. By way of illustration and not limitation, such other processing comprises etching second through-holes in the insulator layer, and forming a second plurality of conductive vias each in a different respective one of the through-holes. Such other processing further forms a second annular structure which extends through the insulator layer, and around the second plurality of conductive vias.

Figure 8:
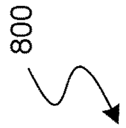
FIG. 8 shows a cross-sectional view illustrating features of an integrated circuit device assembly comprising a composite chiplet according to an embodiment.
Figure 8:
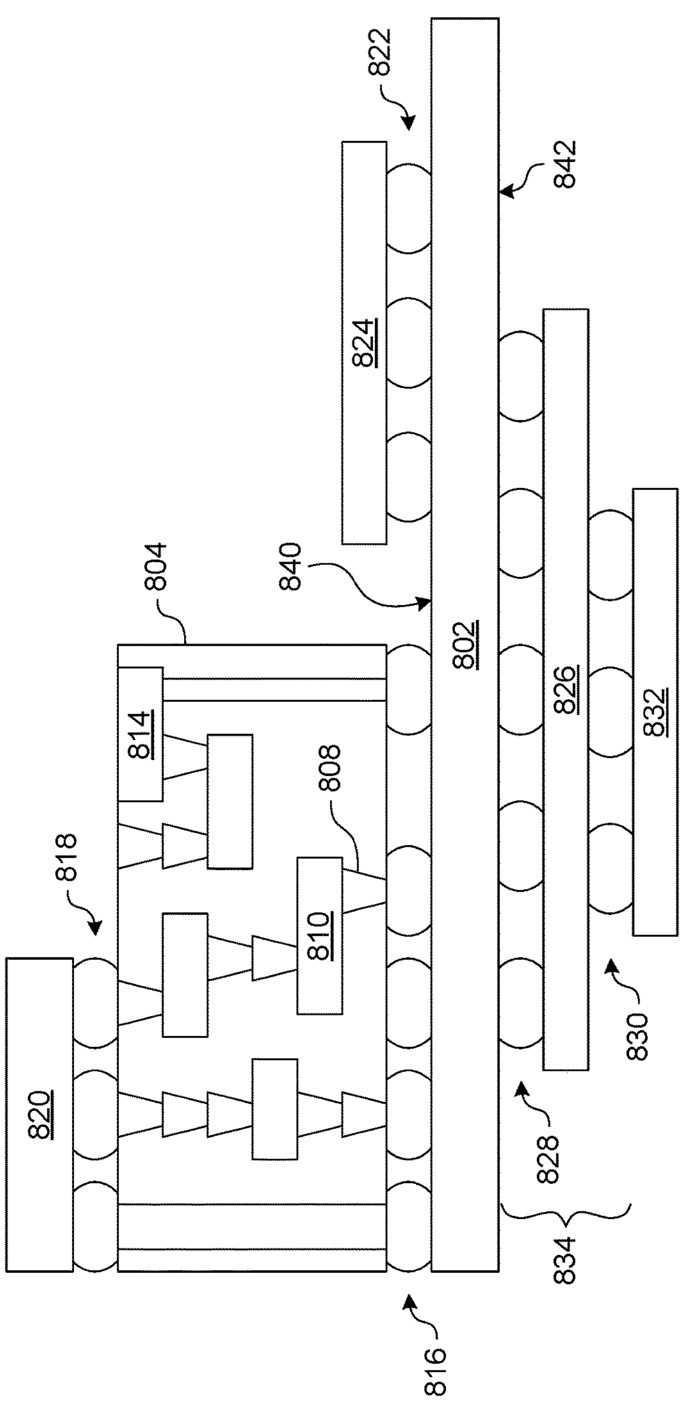

FIG. 8 is a cross-sectional side view of an IC device assembly 800 that may include a composite chiplet having one or more guard ring structures in accordance with any of the embodiments disclosed herein. IC device assembly 800 includes a number of components disposed over a circuit board 802 (which may be, e.g., a motherboard). IC device assembly 800 includes components disposed over a first face 840 of circuit board 802 and an opposing second face 842 of circuit board 802; generally, components may be disposed over one or both faces 840 and 842. In particular, any suitable ones of the components of IC device assembly 800 may include any of the composite chiplets in accordance with any of the embodiments disclosed herein; e.g., any of the IC packages discussed below with reference to IC device assembly 800 may comprises one of composite chiplets 100, 200, 300, 400, 500.

In some embodiments, circuit board 802 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 802. In other embodiments, circuit board 802 may be a non-PCB package substrate.

As illustrated in the figure, in some embodiments, IC device assembly 800 may include a package-on-interposer structure 836 coupled to first face 840 of circuit board 802 by coupling components 816. Coupling components 816 may electrically and mechanically couple package-on-interposer structure 836 to circuit board 802, and may include solder balls (as shown), male and female portions of a socket, an adhesive, an underfill material, and/or any other suitable electrical and/or mechanical coupling structure.

Package-on-interposer structure 836 may include IC package 820 coupled to interposer 804 by coupling components 818. Coupling components 818 may take any suitable form depending on desired functionalities, such as the forms discussed above with reference to coupling components 816. In some embodiments, IC package 820 may include a composite chiplet having annular ring structures such as those in one of composite chiplets 100, 200, 300, 400, 500. In some embodiments, IC package 820 may include at least one composite chiplet 100 as described herein. Composite chiplet 100 is not specifically shown in the figure in order to not clutter the drawing.

Although a single IC package 820 is shown in the figure, multiple IC packages may be coupled to interposer 804; indeed, additional interposers may be coupled to interposer 804. Interposer 804 may provide an intervening package substrate used to bridge circuit board 802 and IC package 820. Generally, interposer 804 may redistribute a connection to a wider pitch or reroute a connection to a different connection. For example, interposer 804 may couple IC package 820 to a BGA of coupling components 816 for coupling to circuit board 802.

In the embodiment illustrated in the figure, IC package 820 and circuit board 802 are attached to opposing sides of interposer 804. In other embodiments, IC package 820 and circuit board 802 may be attached to a same side of interposer 804. In some embodiments, three or more components may be interconnected by way of interposer 804.

Interposer 804 may be formed of an epoxy resin, a fiberglass-reinforced epoxy resin, a ceramic material, or a polymer material such as polyimide. In some implementations, interposer 804 may be formed of alternate rigid or flexible materials that may include the same materials described above for use in a semiconductor substrate, such as silicon, germanium, and other group III-V and group IV materials. Interposer 804 may include metal interconnects 808 and vias 810, including but not limited to TSVs 806. Interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 804. Package-on-interposer structure 836 may take the form of any of the package-on-interposer structures known in the art.

In some embodiments, IC device assembly 800 may include an IC package 824 coupled to first face 840 of circuit board 802 by coupling components 822. Coupling components 822 may take the form of any of the embodiments discussed above with reference to coupling components 816, and IC package 824 may take the form of any of the embodiments discussed above with reference to IC package 820.

In some embodiments, IC device assembly 800 may include a package-on-package structure 834 coupled to second face 842 of circuit board 802 by coupling components 828. Package-on-package structure 834 may include an IC package 826 and an IC package 832 coupled together by coupling components 830 such that IC package 826 is disposed between circuit board 802 and IC package 832. Coupling components 828 and 830 may take the form of any of the embodiments of coupling components 816 discussed above, and IC packages 826 and/or 832 may take the form of any of the embodiments of IC package 820 discussed above. Package-on-package structure 834 may be configured in accordance with any of the package-on-package structures known in the art.

Figure 9:
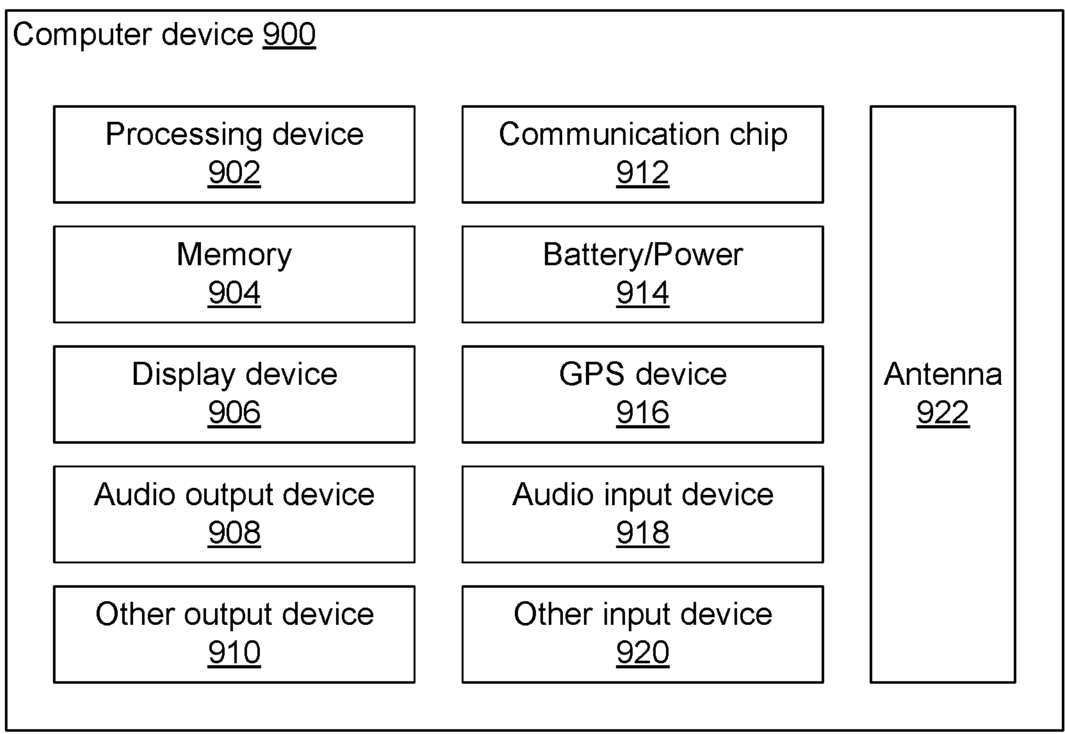
FIG. 9 shows a functional block diagram illustrating features of a computer device comprising a composite chiplet according to an embodiment.

FIG. 9 is a block diagram of an example computer device 900 that may include one or more components having one or more IC packages in accordance with any of the embodiments disclosed herein. For example, any suitable ones of the components of computer device 900 may include a microelectronic assembly with a composite chiplet (e.g., 100), in accordance with any of the embodiments disclosed herein. In another example, any one or more of the components of computer device 900 may include any embodiments of one of composite chiplets 100, 200, 300, 400, 500. In yet another example, any one or more of the components of computer device 900 may include an IC device assembly 800 (e.g., as shown in FIG. 8).

A number of components are illustrated in the figure as included in computer device 900, but any one or more of these components may be omitted or duplicated, as suitable for the application. In some embodiments, some or all of the components included in computer device 900 may be attached to one or more motherboards. In some embodiments, some or all of these components are fabricated onto a single system-on-a-chip (SoC) die.

Additionally, in various embodiments, computer device 900 may not include one or more of the components illustrated in the figure, but computer device 900 may include interface circuitry for coupling to the one or more components. For example, computer device 900 may not include a display device 906, but may include display device interface circuitry (e.g., a connector and driver circuitry) to which display device 906 may be coupled. In another set of examples, computer device 900 may not include an audio input device 918 or an audio output device 908, but may include audio input or output device interface circuitry (e.g., connectors and supporting circuitry) to which audio input device 918 or audio output device 908 may be coupled.

Computer device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 902 may include one or more digital signal processors (DSPs), ASICs, CPUs, GPUs, cryptoprocessors (specialized processors that execute cryptographic algorithms within hardware), server processors, or any other suitable processing devices. Computer device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 904 may include memory that shares a die with processing device 902. This memory may be used as cache memory and may include embedded dynamic random access memory (eDRAM) or spin transfer torque magnetic random access memory (STT-MRAM).

In some embodiments, computer device 900 may include a communication chip 912 (e.g., one or more communication chips). For example, communication chip 912 may be configured for managing wireless communications for the transfer of data to and from computer device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 912 may operate in accordance with other wireless protocols in other embodiments. Computer device 900 may include an antenna 922 to facilitate wireless communications and/or to receive other wireless communications (such as AM or FM radio transmissions).

In some embodiments, communication chip 912 may manage wired communications, such as electrical, optical, or any other suitable communication protocols (e.g., the Ethernet). As noted above, communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as global positioning system (GPS), EDGE, GPRS, CDMA, WiMAX, LTE, EV-DO, or others. In some embodiments, a first communication chip 912 may be dedicated to wireless communications, and a second communication chip 912 may be dedicated to wired communications.

Computer device 900 may include battery/power circuitry 914. Battery/power circuitry 914 may include one or more energy storage devices (e.g., batteries or capacitors) and/or circuitry for coupling components of computer device 900 to an energy source separate from computer device 900 (e.g., AC line power).

Computer device 900 may include a display device 906 (or corresponding interface circuitry, as discussed above). Display device 906 may include any visual indicators, such as a heads-up display, a computer monitor, a projector, a touchscreen display, a liquid crystal display (LCD), a light-emitting diode display, or a flat panel display, for example.

Computer device 900 may include audio output device 908 (or corresponding interface circuitry, as discussed above). Audio output device 908 may include any device that generates an audible indicator, such as speakers, headsets, or earbuds, for example.

Computer device 900 may include audio input device 918 (or corresponding interface circuitry, as discussed above). Audio input device 918 may include any device that generates a signal representative of a sound, such as microphones, microphone arrays, or digital instruments (e.g., instruments having a musical instrument digital interface (MIDI) output).

Computer device 900 may include a GPS device 916 (or corresponding interface circuitry, as discussed above). GPS device 916 may be in communication with a satellite-based system and may receive a location of computer device 900, as known in the art.

Computer device 900 may include other output device 910 (or corresponding interface circuitry, as discussed above). Examples of other output device 910 may include an audio codec, a video codec, a printer, a wired or wireless transmitter for providing information to other devices, or an additional storage device.

Computer device 900 may include other input device 920 (or corresponding interface circuitry, as discussed above). Examples of other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computer device 900 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computer device 900 may be any other electronic device that processes data.

In one or more first embodiments, a device comprises a first integrated circuit (IC) component at a first level, a second IC component at a second level, a first insulator layer at the first level, a first plurality of conductive vias which each extend through the first insulator layer, the first plurality of conductive vias each coupled to respective circuitry of the second IC component, and a first annular structure which extends through the first insulator layer and which surrounds the first plurality of conductive vias in the first insulator layer.

In one or more second embodiments, further to the first embodiment, the device further comprises a second insulator layer at the second level, a second plurality of conductive vias which each extend through the second insulator layer, the second plurality of conductive vias each coupled to respective circuitry of the first level, and a second annular structure which extends through the second insulator layer and which surrounds the second plurality of conductive vias in the second insulator layer, wherein the second annular structure is to resist a transmission of moisture from the second insulator layer.

In one or more third embodiments, further to the first embodiment or the second embodiment, the device further comprises a second plurality of conductive vias which each extend through the first insulator layer, the second plurality of conductive vias each coupled to respective circuitry of the second level, and a second annular structure which extends through the first insulator layer and which surrounds the second plurality of conductive vias in the first insulator layer, wherein the second annular structure is to resist the moisture from the first insulator layer.

In one or more fourth embodiments, further to any of the first through third embodiments, the first annular structure further surrounds the first IC component in the first insulator layer.

In one or more fifth embodiments, further to the fourth embodiment, the first annular structure surrounds all circuit structures which extend in the first insulator layer.

In one or more sixth embodiments, further to any of the first through third embodiments, the device further comprises a first patterned layer at a first side of the first insulator layer, and a second patterned layer at a second side of the first insulator layer, wherein the second side is opposite the first side, wherein the first patterned layer and the second patterned layer each comprise a respective non-metallic material to resist an absorption of moisture by the first insulator layer.

In one or more seventh embodiments, further to the sixth embodiment, the device further comprises a barrier structure which extends along a sidewall of the first IC component to one of the first patterned layer or the second patterned layer, wherein the barrier structure comprises a respective non-metallic material.

In one or more eighth embodiments, further to any of the first through third embodiments, the first annular structure comprises a metal.

In one or more ninth embodiments, further to any of the first through third embodiments, the first insulator layer comprises an oxide, and wherein the first annular structure comprises a nitride.

In one or more tenth embodiments, further to the ninth embodiment, the first annular structure comprises multiple layers each of a different respective non-metallic material.

In one or more eleventh embodiments, a method comprises depositing a first dielectric material around a first integrated circuit (IC) component to form a first insulator layer, etching first through-holes in the first insulator layer, forming a first plurality of conductive vias each in a different respective one of the first through-holes, forming a first annular structure which extends through the first insulator layer and which surrounds the first plurality of conductive vias in the first insulator layer, and coupling a second IC component to one or more of the first plurality of conductive vias, wherein a first level of a tile comprises the first insulator layer, the first IC component, the first plurality of conductive vias, and the first annular structure, and wherein a second level of the tile comprises the second IC component.

In one or more twelfth embodiments, further to the eleventh embodiment, the method further comprises depositing a second dielectric material around the second IC component to form a second insulator layer, etching second through-holes in the second insulator layer, forming a second plurality of conductive vias each in a different respective one of the second through-holes, and forming a second annular structure which extends through the second insulator layer and which surrounds the second plurality of conductive vias in the second insulator layer, wherein the second annular structure is to resist moisture from the second insulator layer.

In one or more thirteenth embodiments, further to any of the eleventh embodiment or the twelfth embodiment, the method further comprises etching second through-holes in the first insulator layer, forming a second plurality of conductive vias each in a different respective one of the first through-holes, and forming a second annular structure which extends through the first insulator layer and which surrounds the second plurality of conductive vias in the second insulator layer.

In one or more fourteenth embodiments, further to any of the eleventh through thirteenth embodiments, the first annular structure further surrounds the first IC component in the first insulator layer.

In one or more fifteenth embodiments, further to the fourteenth embodiment, the first annular structure surrounds all circuit structures which extend in the first insulator layer.

In one or more sixteenth embodiments, further to any of the eleventh through thirteenth embodiments, the method further comprises forming a first patterned layer at a first side of the first insulator layer, and forming a second patterned layer at a second side of the first insulator layer, wherein the second side is opposite the first side, wherein the first patterned layer and the second patterned layer each comprise a respective non-metallic material to resist an absorption of moisture by the first insulator layer.

In one or more seventeenth embodiments, further to the sixteenth embodiment, the method further comprises forming a barrier structure which extends along a sidewall of the first IC component to one of the first patterned layer or the second patterned layer, wherein the barrier structure comprises a respective non-metallic material.

In one or more eighteenth embodiments, further to any of the eleventh through thirteenth embodiments, the first annular structure comprises a metal.

In one or more nineteenth embodiments, further to any of the eleventh through thirteenth embodiments, the first insulator layer comprises an oxide, and wherein the first annular structure comprises a nitride.

In one or more twentieth embodiments, further to the nineteenth embodiment, the first annular structure comprises multiple layers each of a different respective non-metallic material.

In one or more twenty-first embodiments, a system comprises a microprocessor, and a memory coupled to the microprocessor, wherein at least one of the memory or the microprocessor comprises circuitry on a tile comprising a first integrated circuit (IC) component at a first level, a second IC component at a second level, a first insulator layer at the first level, a first plurality of conductive vias which each extend through the first insulator layer, the first plurality of conductive vias each coupled to respective circuitry of the second IC component, and a first annular structure which extends through the first insulator layer and which surrounds the first plurality of conductive vias in the first insulator layer.

In one or more twenty-second embodiments, further to the twenty-first embodiment, the tile further comprises a second insulator layer at the second level, a second plurality of conductive vias which each extend through the second insulator layer, the second plurality of conductive vias each coupled to respective circuitry of the first level, and a second annular structure which extends through the second insulator layer and which surrounds the second plurality of conductive vias in the second insulator layer, wherein the second annular structure is to resist a transmission of moisture from the second insulator layer.

In one or more twenty-third embodiments, further to the twenty-first embodiment or the twenty-second embodiment, the tile further comprises a second plurality of conductive vias which each extend through the first insulator layer, the second plurality of conductive vias each coupled to respective circuitry of the second level, and a second annular structure which extends through the first insulator layer and which surrounds the second plurality of conductive vias in the first insulator layer, wherein the second annular structure is to resist the moisture from the first insulator layer.

In one or more twenty-fourth embodiments, further to any of the twenty-first through twenty-third embodiments, the first annular structure further surrounds the first IC component in the first insulator layer.

In one or more twenty-fifth embodiments, further to the twenty-fourth embodiment, the first annular structure surrounds all circuit structures which extend in the first insulator layer.

In one or more twenty-sixth embodiments, further to any of the twenty-first through twenty-third embodiments, the tile further comprises a first patterned layer at a first side of the first insulator layer, and a second patterned layer at a second side of the first insulator layer, wherein the second side is opposite the first side, wherein the first patterned layer and the second patterned layer each comprise a respective non-metallic material to resist an absorption of moisture by the first insulator layer.

In one or more twenty-seventh embodiments, further to the twenty-sixth embodiment, the tile further comprises a barrier structure which extends along a sidewall of the first IC component to one of the first patterned layer or the second patterned layer, wherein the barrier structure comprises a respective non-metallic material.

In one or more twenty-eighth embodiments, further to any of the twenty-first through twenty-third embodiments, the first annular structure comprises a metal.

In one or more twenty-ninth embodiments, further to any of the twenty-first through twenty-third embodiments, the first insulator layer comprises an oxide, and wherein the first annular structure comprises a nitride.

In one or more thirtieth embodiments, further to the twenty-ninth embodiment, the first annular structure comprises multiple layers each of a different respective non-metallic material.

Techniques and architectures for mitigating corrosion in a composite chiplet are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:

a first tile which extends vertically through a first level;

a second tile which extends vertically through a second level which is over the first level;

a first layer of a first insulator material which extends vertically between the first level and the second level;

a second layer of a second insulator material which extends vertically through the second level;

a first plurality of conductive vias which each extend through the first layer in a region under the second tile, the first plurality of conductive vias each electrically coupled to respective integrated circuitry of the second tile; and a first annular structure which extends through the first layer and which surrounds the first plurality of conductive vias in the first layer;

wherein:

the first tile is electrically coupled to a circuit structure which is disposed in the second layer;

respective first ends of the first plurality of conductive vias are each at a top of the first layer;

respective second ends of the first plurality of conductive vias are each at a bottom of the first layer;

the first annular structure forms a barrier which is contiguous both around the first plurality of conductive vias, and from the top of the first layer to the bottom of the first layer, wherein a first contiguous portion of the first insulator material is separated by the barrier from a second contiguous portion of the first insulator material;

the first contiguous portion extends around and adjoins an exterior sidewall of the first annular structure;

the second contiguous portion adjoins an interior sidewall of the first annular structure, wherein the second contiguous portion further adjoins and extends around each of the first plurality of conductive vias; and one of the first contiguous portion or the second contiguous portion further extends around and adjoins the first tile.

2. The device of claim 1, further comprising:

a second plurality of conductive vias which each extend through the second layer, the second plurality of conductive vias each coupled to respective circuitry of the first level; and a second annular structure which extends through the second layer and which surrounds the second plurality of conductive vias in the second layer, wherein the second annular structure is to resist a transmission of moisture from the second layer.

3. The device of claim 1, further comprising:

a second plurality of conductive vias which each extend through the first layer, the second plurality of conductive vias each coupled to respective circuitry of the second level; and a second annular structure which extends through the first layer and which surrounds the second plurality of conductive vias in the first layer, wherein the second annular structure is to resist moisture from the first layer.

4. The device of claim 1, wherein the first annular structure further surrounds the first tile in the first layer.

5. The device of claim 4, wherein the first annular structure surrounds all circuit structures which extend in the first layer.

6. The device of claim 1, further comprising:

a first patterned layer at a first side of the first layer; and a second patterned layer at a second side of the first layer, wherein the second side is opposite the first side;

wherein the first patterned layer and the second patterned layer each comprise a respective non-metallic material to resist an absorption of moisture by the first layer.

7. The device of claim 6, further comprising:

a barrier structure which extends along a sidewall of the first tile to one of the first patterned layer or the second patterned layer, wherein the barrier structure comprises a respective non-metallic material.

8. The device of claim 1, wherein the first annular structure comprises a metal.

9. The device of claim 1, wherein the first layer comprises an oxide, and wherein the first annular structure comprises a nitride.

10. The device of claim 9, wherein the first annular structure comprises multiple layers each of a different respective non-metallic material.

11. A system comprising:

a microprocessor; and a memory coupled to the microprocessor, wherein at least one of the memory or the microprocessor comprises:

a first tile which extends vertically through a first level;

a second tile which extends vertically through a second level which is over the first level;

a first layer of a first insulator material which extends vertically between the first level and the second level;

a second layer of a second insulator material which extends vertically through the second level;

a first plurality of conductive vias which each extend through the first layer in a region under the second tile, the first plurality of conductive vias each electrically coupled to respective integrated circuitry of the second tile; and a first annular structure which extends through the first layer and which surrounds the first plurality of conductive vias in the first layer;

wherein:

the first tile is electrically coupled to a circuit structure which is disposed in the second layer;

respective first ends of the first plurality of conductive vias are each at a top of the first layer;

respective second ends of the first plurality of conductive vias are each at a bottom of the first layer;

the first annular structure forms a barrier which is contiguous both around the first plurality of conductive vias, and from the top of the first layer to the bottom of the first layer, wherein a first contiguous portion of the first insulator material is separated by the barrier from a second contiguous portion of the first insulator material;

the first contiguous portion extends around and adjoins an exterior sidewall of the first annular structure;

the second contiguous portion adjoins an interior sidewall of the first annular structure, wherein the second contiguous portion further adjoins and extends around each of the first plurality of conductive vias; and one of the first contiguous portion or the second contiguous portion further extends around and adjoins the first tile.

12. The system of claim 11, wherein the tile further comprises:

a second plurality of conductive vias which each extend through the second layer, the second plurality of conductive vias each coupled to respective circuitry of the first level; and a second annular structure which extends through the second layer and which surrounds the second plurality of conductive vias in the second layer, wherein the second annular structure is to resist a transmission of moisture from the second layer.

13. The system of claim 11, wherein the tile further comprises:

a second plurality of conductive vias which each extend through the first layer, the second plurality of conductive vias each coupled to respective circuitry of the second level; and a second annular structure which extends through the first layer and which surrounds the second plurality of conductive vias in the first layer, wherein the second annular structure is to resist moisture from the first layer.

14. The system of claim 11, wherein the tile further comprises:

a first patterned layer at a first side of the first layer; and a second patterned layer at a second side of the first layer, wherein the second side is opposite the first side;

wherein the first patterned layer and the second patterned layer each comprise a respective non-metallic material to resist an absorption of moisture by the first layer.

15. The system of claim 11, wherein the first layer comprises an oxide, and wherein the first annular structure comprises a nitride.

* * * * *